United States Patent
Vuong et al.

(10) Patent No.: US 7,328,419 B2
(45) Date of Patent: Feb. 5, 2008

(54) PLACE AND ROUTE TOOL THAT INCORPORATES A METAL-FILL MECHANISM

(75) Inventors: Thanh Vuong, Milpitas, CA (US); William H. Kao, Fremont, CA (US); David C. Noice, Palo Alto, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 247 days.

(21) Appl. No.: 10/300,715

(22) Filed: Nov. 19, 2002

(65) Prior Publication Data

US 2004/0098674 A1     May 20, 2004

(51) Int. Cl.
*G06F 17/50* (2006.01)
(52) U.S. Cl. ............... 716/11; 716/8; 716/9; 716/10
(58) Field of Classification Search .......... 716/4–14; 438/618; 257/E23.151, E23.152, E23.153
See application file for complete search history.

(56) References Cited

U.S. PATENT DOCUMENTS

| | | | |
|---|---|---|---|
| 4,721,689 A * | 1/1988 | Chaloux et al. ............ 438/618 |
| 4,785,337 A | 11/1988 | Kenney | |
| 5,032,890 A | 7/1991 | Ushiku et al. | |
| 5,347,465 A | 9/1994 | Ferreri et al. | |
| 5,350,712 A | 9/1994 | Shibata | |
| 5,547,887 A | 8/1996 | Brown et al. | |
| 5,636,133 A * | 6/1997 | Chesebro et al. ............ 716/4 |
| 5,763,955 A * | 6/1998 | Findley et al. ............ 257/775 |
| 5,789,313 A | 8/1998 | Lee | |
| 5,892,249 A | 4/1999 | Courtright et al. | |
| 5,923,563 A | 7/1999 | Lavin et al. | |
| 6,093,631 A | 7/2000 | Jaso et al. | |
| 6,121,078 A | 9/2000 | DeBrosse et al. | |
| 6,174,804 B1 | 1/2001 | Hsu | |
| 6,189,133 B1 | 2/2001 | Durham et al. | |
| 6,265,308 B1 | 7/2001 | Bronner et al. | |
| 6,305,000 B1 * | 10/2001 | Phan et al. ............ 716/5 |
| 6,311,315 B1 * | 10/2001 | Tamaki ............ 716/7 |
| 6,319,820 B1 | 11/2001 | Liu | |
| 6,323,113 B1 | 11/2001 | Gabriel et al. | |
| 6,351,019 B1 | 2/2002 | DeBrosse et al. | |
| 6,388,332 B1 | 5/2002 | Aggarwal et al. | |

(Continued)

OTHER PUBLICATIONS

Kahng et al.; "Filling algorithms and analyses for layout density control"; Computer-Aided Design of Integrated Circuits and Systems, IEEE Transactions on vol. 18, Issue 4, Apr. 1999 pp. 445-462.*

(Continued)

*Primary Examiner*—Thuan Do
*Assistant Examiner*—Naum B. Levin
(74) *Attorney, Agent, or Firm*—Bingham McCutchen LLP

(57) ABSTRACT

Disclosed is a method, system, and article of manufacture for a one-pass approach for implementing metal-fill for an integrated circuit. Also disclosed is a method, system, and article of manufacture for implementing metal-fill that is coupled to a tie-off connection. An approach that is disclosed comprises a method, system, and article of manufacture for implementing metal-fill having an elongated shape that corresponds to the length of whitespace. Also disclosed is the aspect of implementing metal-fill that matches the routing direction. Yet another disclosure is an implementation of a place & route tool incorporating an integrated metal-fill mechanism.

26 Claims, 16 Drawing Sheets

U.S. PATENT DOCUMENTS

| | | | |
|---|---|---|---|
| 6,404,226 | B1 | 6/2002 | Schadt |
| 6,484,300 | B1 | 11/2002 | Kim et al. |
| 6,498,385 | B1 | 12/2002 | Daubenspeck et al. |
| 6,499,135 | B1 * | 12/2002 | Li et al. .................. 716/19 |
| 6,600,341 | B2 | 7/2003 | Bingert et al. |
| 6,609,235 | B2 | 8/2003 | Ramaswamy et al. |
| 6,643,828 | B2 | 11/2003 | Naffziger et al. |
| 6,701,509 | B2 * | 3/2004 | Aggarwal et al. ............ 716/13 |
| 6,794,674 | B2 * | 9/2004 | Kusumoto ........... 257/E23.151 |
| 6,867,127 | B1 | 3/2005 | Hung |
| 6,887,633 | B2 | 5/2005 | Tang |
| 7,012,335 | B2 | 3/2006 | Lee et al. |
| 2002/0199162 | A1 | 12/2002 | Ramaswamy et al. |
| 2003/0115560 | A1 | 6/2003 | Naffziger et al. |
| 2004/0044983 | A1 * | 3/2004 | Dillon et al. ................. 716/21 |
| 2004/0098393 | A1 | 5/2004 | Vuong et al. |
| 2004/0098688 | A1 | 5/2004 | Vuong et al. |
| 2005/0044520 | A1 | 2/2005 | Vuong et al. |

OTHER PUBLICATIONS

Chen, Y., "Area Fill Synthesis for Uniform Layout Density," *IEEE Transactions on Computer Aided Design of Integrated Circuits and Systems*, vol. 21, No. 10, Oct. 2002, pp. 1132-1147.

Fulton, J. A. et al., "Electrical and Mechanical Properties of a Metal-Filled Polymer Composite for Interconnection and Testing Applications," *Proceedings 39th Electronic Components Conference*, 1989, May 22-24, 1989, pp. 71-77.

Lin, R., Comments on "Filling Algorithms and Analyses for Layout Density Control," *IEEE Transactions on Computer Aided Design of Integrated Circuits and Systems*, vol. 21, No. 10, Oct. 2002, pp. 1209-1211.

Mokhoff, N., "Smooth' Layout Tool Promises Better IC Yields," *Electronic Engineering Times*, Nov. 11, 2002, p. 49.

Stine, B. E. et al., "Rapid Characterization and Modeling of Pattern-Dependent Variation In Chemical-Mechanical Polishing," *IEEE Transactions on Semiconductor Manufacturing*, vol. 11, No. 1, Feb. 1998, pp. 129-140.

Stine, B. E., et al., "The Physical and Electrical Effects of Metal-Fill Patterning practices for Oxide Chemical-Mechanical Polishing Processes," *IEEE Transactions on Electron Devices*, vol. 45, No. 3, Mar. 1998, pp. 665-679.

Bryant, R.E. et al. "Limitations and Challenges of Computer-Aided Design Techology for CMOS VLSI" Proceedings of the IEEE (Mar. 2001) 89(3):341-365.

Kahng, A.B. et al. "Filling and Slotting: Analysis and Algorithms" [online] 1988, pp. 1-8, 1998 International Symposium on Physical Design ACM New York, NY. Retrieved from the internet: URL:http://vlsicad.ucsd.edu/Publications/Conferences/c75.pdf.

Kahng, A.B. "IC Layout and Manufacturability: Critical Links and Design Flow Implications" [online ] 1999, pp. 1-7. Retrieved from the Internet: URL:http://ieeexplore.ieee.org/iel4/6007/16057/00745132.pdf?insnumber=&amumber=745132>.

Kahng, A.B. et al. "Filling Algorithms and Analyses for Layout Density Control" IEEE Transactions on Computer-Aided Design of Integrated Circuits and Systems (Apr. 1999) 18(4):445-462.

Nelson, M. et al. "Optimizing Pattern Fill for Planarity and Parasitic Capacitance" Advanced Semiconductor Manufacturing, 2004, ASMC '04. IEEE Conference and Workshop, Boston, MA (May 4-6, 2004) pp. 115-118.

Tian, R. et al. "Model-Based Dummy Feature Placement for Oxide Chemical-Mechanical Polishing Manufacturability" IEEE Transactions on Computer-Aided Design of Integrated Circuits and Systems (Jul. 2001) 20(7):902-910.

International Search Report dated Aug. 6, 2004 for PCT Application No. PCT/US03/36989.

Partial European Search Report dated Mar. 2, 2006 for European Appl. No. 03786859.3.

Supplementary European Search Report dated Jun. 23, 2006 for European Appl. No. 03786859.3.

* cited by examiner

Wa, Wb, Wc: window that overlaps 3, 5 and 8 other windows respectively

|  Region 1 |  Region 3 |
|---|---|
|  Region 2 |  Region 4 |

After vertical merge from fig 2C → After horizontal merge

After horizontal merge → After vertical merge

Whitespace before split → first vertical split → then horizontal split

Whitespace before split → first vertical split → then horizontal split

PLACE AND ROUTE TOOL THAT INCORPORATES A METAL-FILL MECHANISM

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent files and records, but otherwise reserves all other copyright rights.

BACKGROUND AND SUMMARY

The invention relates to the design and manufacture of integrated circuits, and more particularly, to techniques, systems, and methods for implementing metal-fill patterns on an integrated circuit.

In recent years, in IC manufacturing, chemical-mechanical polishing (CMP) has emerged as an important technique for planarizing dielectrics because of its effectiveness in reducing local step height and achieving a measure of global planarization not normally possible with spin-on and resist etch back techniques. However, CMP processes have been hampered by layout pattern dependent variation in the inter-level dielectric (ILD) thickness which can reduce yield and impact circuit performance. A common approach for reducing layout pattern dependent dielectric thickness variation is to change the layout pattern itself via the use of metal-fill patterning.

Metal-fill patterning is the process of filling large open areas on each metal layer with a metal pattern to compensate for pattern-driven variations. The manufacturer of the chip normally specifies a minimum and maximum range of metal that should be present at each portion of the die. If there is an insufficient amount of metal at a particular portion or "window" on the chip, then metal-fill is required to increase the proportion of metal in that portion or window. Otherwise, an insufficient amount of metal may cause bumps to exist in the finished chip. However, too much metal may cause dishing to occur. Therefore, the metal-fill process should not cause the die to exceed any specified maximum range of metal for the chip.

FIG. 1 shows a "fixed template" approach for performing metal-fill patterning, in which a template pattern is overlaid with the chip design, the results are tested with a separate analysis step, and then new fixed shapes are added or the starting point (offset) of the fixed shapes is shifted until the minimum density is met in every area.

To explain further, in this approach, a chip layout is divided into a set of delineated portions or windows. For each window, the metal features or "blockages" 103 are identified, as shown in window 102. If the proportion of metal in that window is below a specified minimum percentage, then metal-fill patterning is performed to increase the amount of metal. In many cases, the designer or manufacturer will specify a minimum distance around each blockage that should not contain the additional metal-fill. As shown in window 104, a fence 105 is established around each blockage 103 in the window to maintain this minimum distance around each blockage.

A fill template is selected to provide the metal-fill pattern. The fill template is a fixed pattern of uniform metal shapes, e.g., an array of 2 um×2 um shapes spaced apart by 2 um, as shown in the example fill template of window 106. Once a fill template has been selected, the fenced blockage window 104 is overlaid upon the fill template, resulting in the new chip layout as shown in window 108.

At this point, a determination is made whether the layout meets minimum and maximum metal requirements. In some cases, the selected metal-fill pattern may contain too much metal, causing the new layout to exceed maximum metal percentages as specified by the manufacturer. In other cases, the metal-fill pattern may contain too little metal, causing the new layout to fall beneath specified minimum metal percentages. In either case, a new metal-fill pattern must be selected and the overlaying process repeated.

In certain instances, the metal-fill pattern may be sufficient, but must be "shifted" to properly fit against the fenced blockage window. For example, it can be seen in portion 110 of window 108 that because of the uneven distances between blockages, the metal-fill pattern does not exactly fit within the spaces between the blockages. Thus, the fixed, regular pattern of the metal in the metal-fill causes portions 112 and 114 of the new layout in window 108 to contain less metal than other portions. This can be corrected by shifting the metal-fill pattern 106 against the fenced blockage window 104 until a more optimal metal percentage is achieved.

The process of re-selecting a new metal-fill pattern or shifting the metal-fill pattern and then re-performing the overlaying is iteratively repeated until the final layout satisfies the minimum and maximum metal percentage requirements for the chip. In effect, this fixed template approach may be seen as a trial and error approach in which multiple passes through the metal-fill selection/overlaying process is needed to achieve an acceptable metal percentage. This trial and error approach can be costly and inefficient, particularly if the iterative steps of the process must be manually performed. Moreover, as new chip designs become smaller, the required metal percentage requirements become even stricter, which may require even more passes through this process to achieve an acceptable metal percentage.

To overcome the disadvantages of these and other approaches, the present invention provides an improved method, system, and article of manufacture for implementing metal-fill for an integrated circuit. A disclosed embodiment calculates the best offset in each area to be filled and dynamically adjust shape widths and different shape lengths that best fill that area, in which only a single pass is needed to appropriately determine the metal-fill pattern. An embodiment also simultaneously optimizes across multiple metal-fill windows such that that the process will not add shapes in a window that would exceed the maximum density, while attempting to make all windows match the preferred density, and meeting the minimum density.

Also disclosed is a method, system, and article of manufacture for implementing metal-fill that is coupled to a tie-off connection. An embodiment that is disclosed comprises a method, system, and article of manufacture for implementing metal-fill having an elongated shape that corresponds to the length of whitespace. Also disclosed is the aspect of implementing metal-fill that matches the routing direction. Yet another disclosure is an implementation of a-place & route tool incorporating an integrated metal-fill mechanism. Other and additional objects, features, and advantages of the invention are described in the detailed description, figures, and claims.,

DETAILED DESCRIPTION

The present invention is directed to an improved method, system, and article of manufacture for implementing metal-fill for an integrated circuit. A disclosed embodiment calculates the best offset in each local area to be filled (e.g. minimum spacing from the existing metal), and dynamically adjust shape widths and different shape lengths that best fill that area. A metal-fill window will be processed in one pass, with possibly different sizes or shapes of metal-fill in the windows. An embodiment also simultaneously optimizes across multiple metal-fill windows such that that the process will not add shapes in a window that would exceed the maximum density, while attempting to make all windows match the preferred density, and meeting the minimum density.

Figure 2:
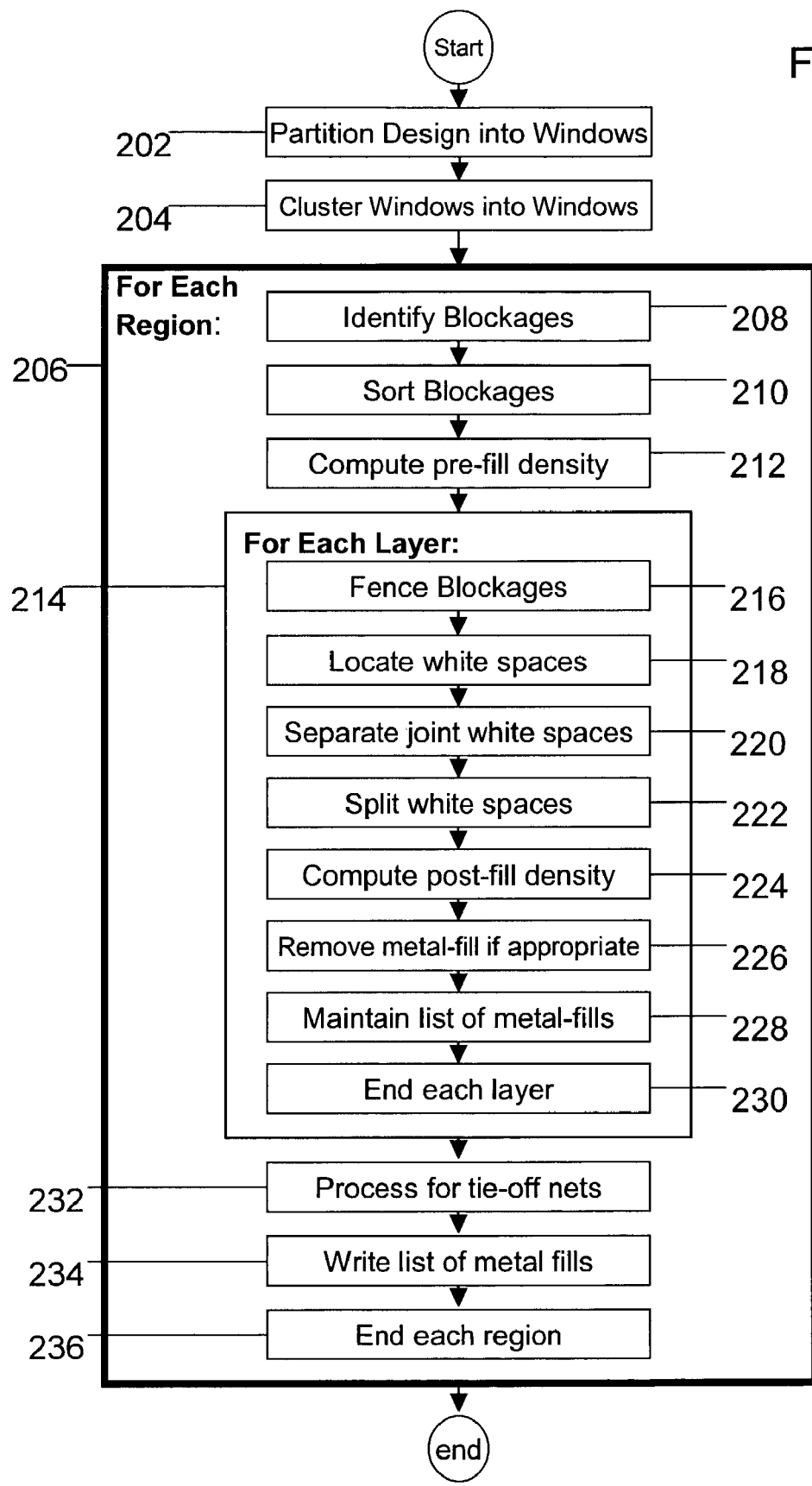
FIG. 2 shows a flowchart of a process for implementing metal-fill according to an embodiment of the invention.

FIG. 2 shows a flowchart of a metal-fill procedure according to an embodiment of the invention. Some example inputs to this procedure are: (a) the minimum and maximum fill width and length; (b) minimum, maximum and preferred density; (c) design rule spacing, window size and step size; and (d) optional list of tie-off nets to connect to. In many cases, input parameters (a), (b), and (c) are specified by the chip manufacturer. As described in more detail below, the list of tie-off nets for (d) can be provided to connect the metal-fill to ground or power nets. The output of the procedure is a list of metal-fills inserted in the design.

At 202, the design is partitioned into a collection of windows. The required/desired window size can be specified by, for example, the chip manufacturer. In this process action, the design is divided into windows of the desired size, e.g., 100×100 microns or 50×50 microns.

Figure 3:
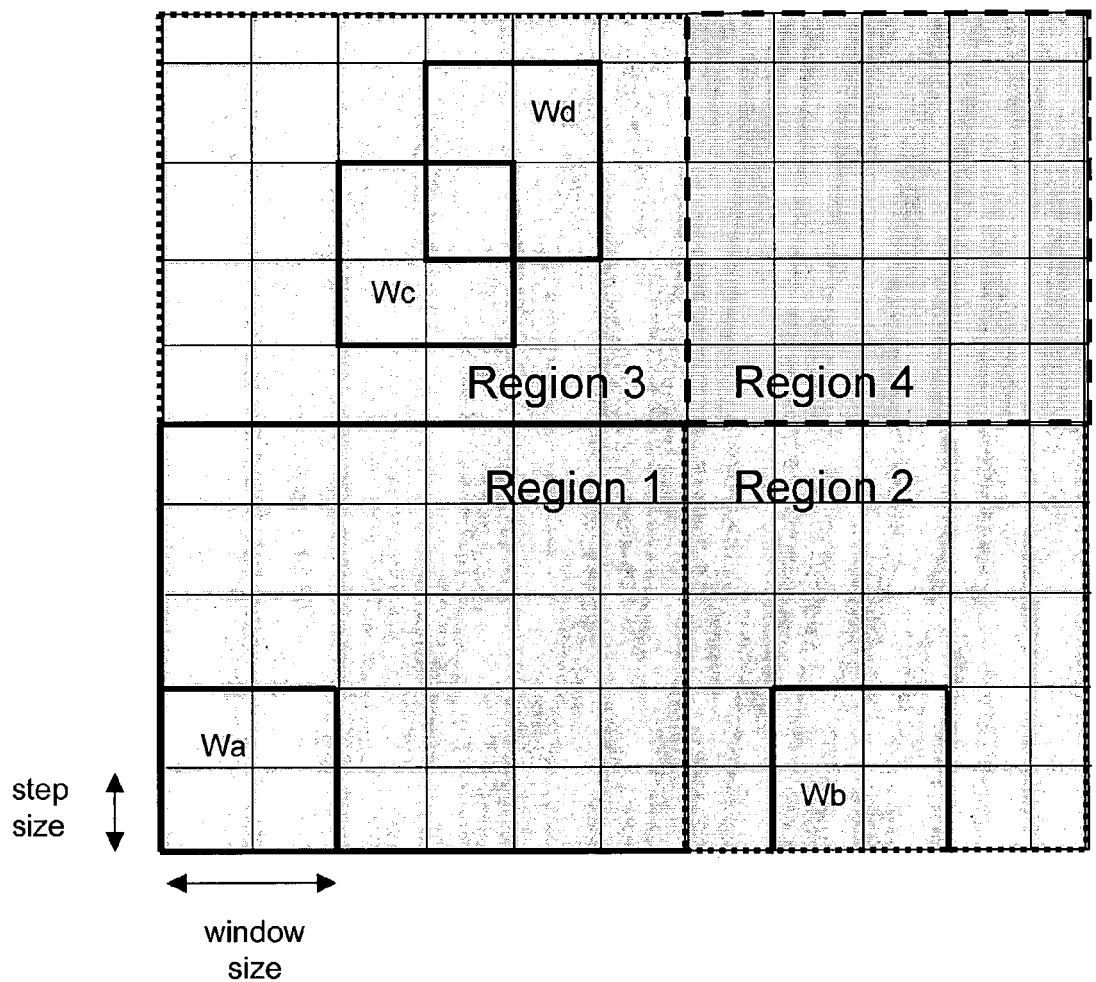
FIG. 3 illustrates partitioning a design into windows and regions according to an embodiment of the invention.
Figure 3:
Figure 3:
Figure 3:
Figure 3:

FIG. 3 shows an example of a design that has been partitioned into a number of windows. Each window may overlap a number of other windows depending on the window step size. For instance, a window step size can be chosen to be one half the window sizes. In such case, a window may overlap 3, 5 or 8 other windows. In FIG. 3, window We overlaps eight other windows (including window Wd), window Wb overlaps five other windows, and window Wa overlaps three other windows.

In one embodiment, the first window starts at the lower left of the design. An area look-up data structure can be built to support area searching during the metal-fill process. In one embodiment, a "kd-tree" (WindowTree) structure is built to support area searching. As known to those of skill in the art, a kd-tree refers to a well-known data structure that supports efficient geometric data retrieval. For purposes of illustration only, and not by way of limitation, the present embodiment of the invention is described using the kd-tree structure.

After the design has been partitioned into windows, the windows can be clustered into defined regions (204 from FIG. 2). This action is optionally performed to optimize computing efficiency, particularly if the process is constrained by limitations with respect to system memory. The size of each region is approximately N routing grids (or windows) in width and height. Each region consists of one or more windows to be filled. Region size is chosen to achieve runtime and memory consumption in linear proportion to the design size. FIG. 3 illustrates a collection of windows that have been clustered into four regions (regions 1, 2, 3, and 4). In this illustrated example, window Wa is in region 1, window Wb is in region 2, and window We is in region 3.

Referring back to the flowchart of FIG. 2, for each region (if the windows are clustered into regions), the present procedure performs the actions identified in box 206. At 208, blockages are identified in the design. These blockages include, for example, wires, cells, pins, and obstructions inside a cell as well as wires, pins, and obstructions in the design. At 210, the blockages are sorted according to their respective layers in the design.

At 212, the procedure computes the pre-filled density per window per layer. Computing the density values can be rendered more efficient by using an abstract of standard cells in the design. The abstract provides an estimated/composite density value that can be used for all associated standard cells, instead of performing costly calculation activities to determine the exact density contributed by each portion of a standard cell. Depending upon the specific standard cell, this approach may result in some amount of inaccuracy in the final density calculations (e.g., if the cell straddles two windows), which may be generally acceptable.

Figure 4:
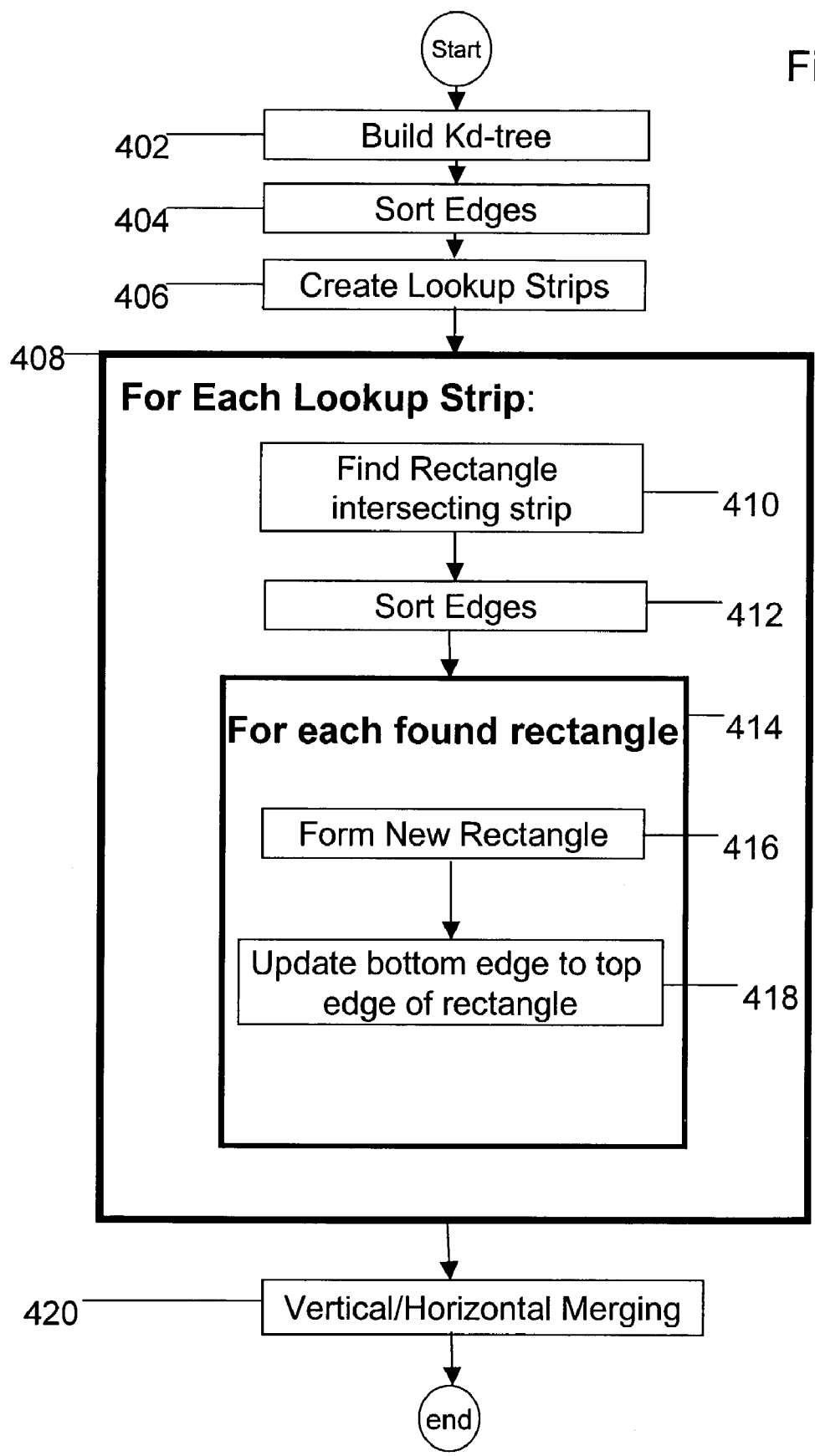
FIG. 4 shows a process for performing merge/sort of blockages according to an embodiment of the invention.
Figure 5A:
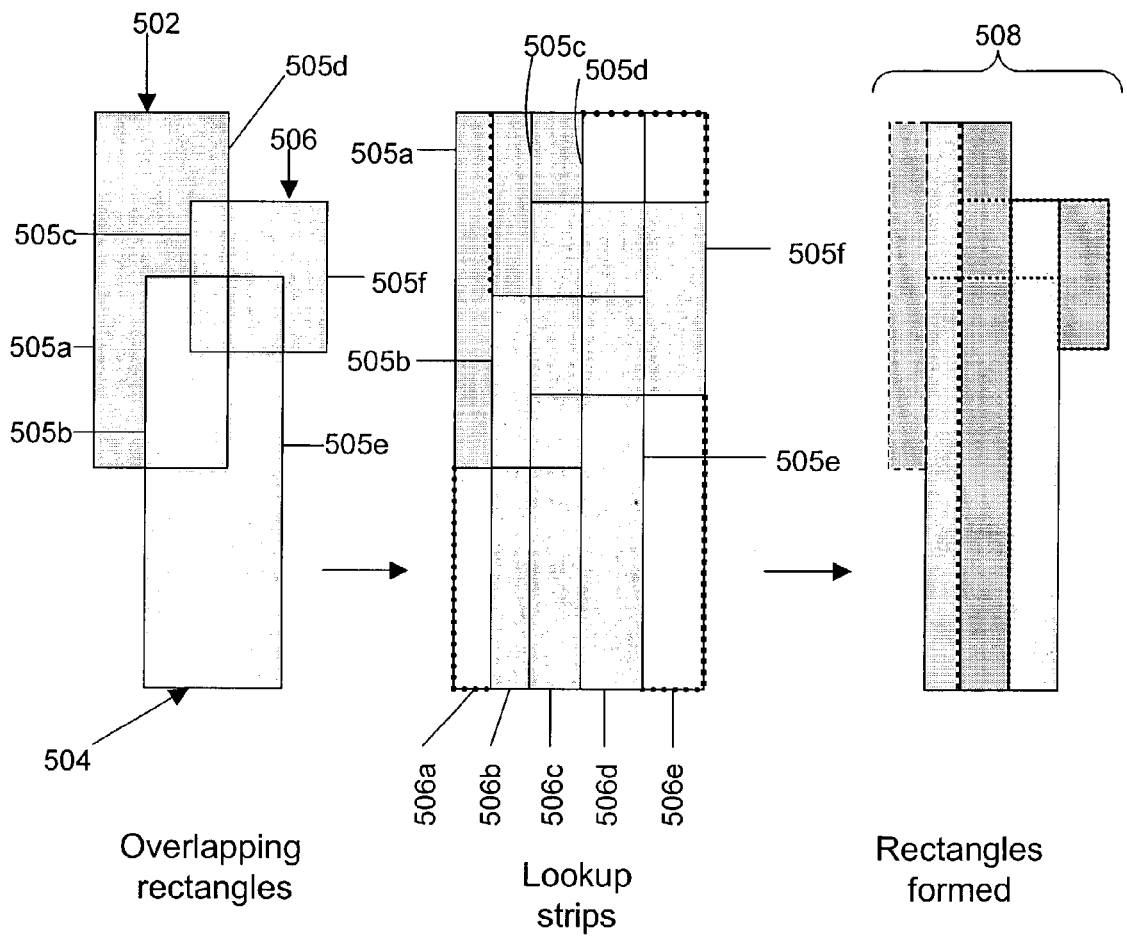
FIGS. 5a, 5b, and 5c illustrate the process of FIG. 4.

Blockages (rectangles) are merged and extracted to ensure that overlapping blockages are counted only once. This avoids over-calculating the density for a particular window. FIG. 4 depicts a flowchart of a process for merging/extracting the blockages according to one embodiment of the invention, which is illustrated using FIGS. 5a, 5b, and 5c. For purposes of explanation, this section of the detailed description will jump between the flowchart of FIG. 4 and the illustrative example of FIGS. 5a-c. At 402, the process builds an area look-up data structure, e.g., a kd-tree of rectangles. The edges of rectangles are sorted from left to right (404). At 406, the process creates lookup strips using the sorted edges. The example of FIG. 5a shows a set of three overlapping rectangles 502, 504, and 506, having edges 505a, 505b, 505c, 505d, 505e, and 505f. Action 406 is illustrated in FIG. 5a with edges 505a, 505b, 505c, 505d, 505e, and 505f being used to create lookup strips 506a, 506b, 506c, 506d, and 506e.

For each lookup strip, the process performs the actions shown in box 408. At 410, the process finds rectangles intersecting the lookup strip from the kd-tree structure. The edges of the found rectangles are sorted, e.g., from bottom to top (412).

For each found rectangle, the process performs the action shown in box 414. The new rectangle is formed using sides from the lookup strip and the found rectangle (416). The bottom edge of the lookup strip to top edge of rectangle is updated (418). FIG. 5*a* shows the found rectangles 508 based upon the lookup strips 506*a*, 506*b*, 506*c*, 506*d*, and 506*e*.

Figure 5B:
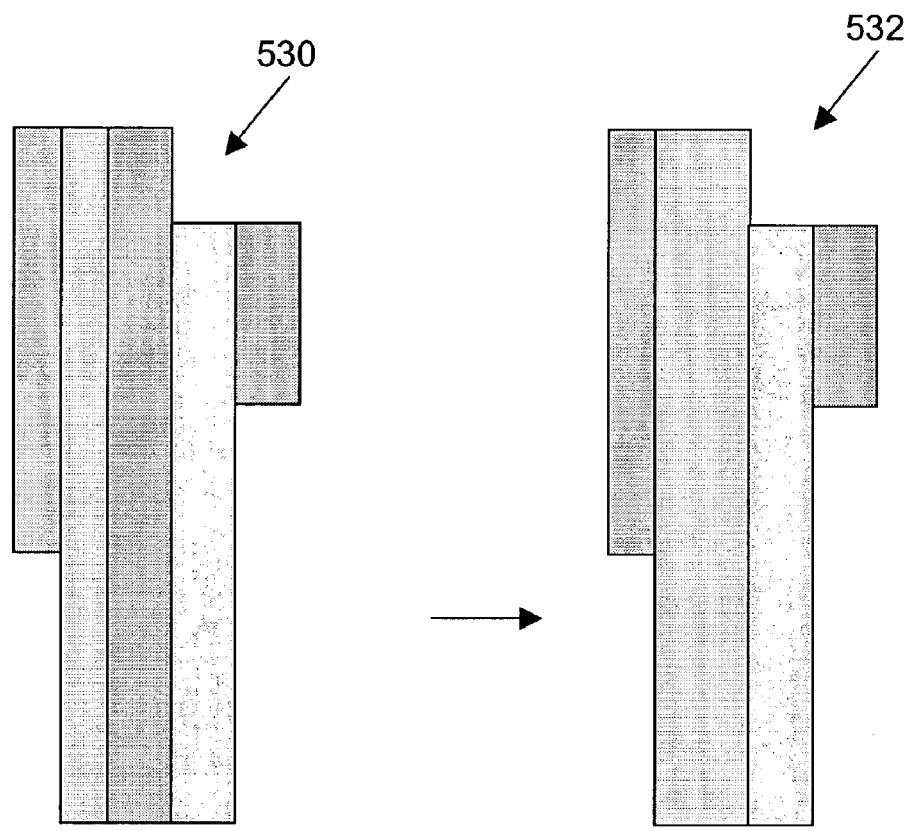
Figure 5C:
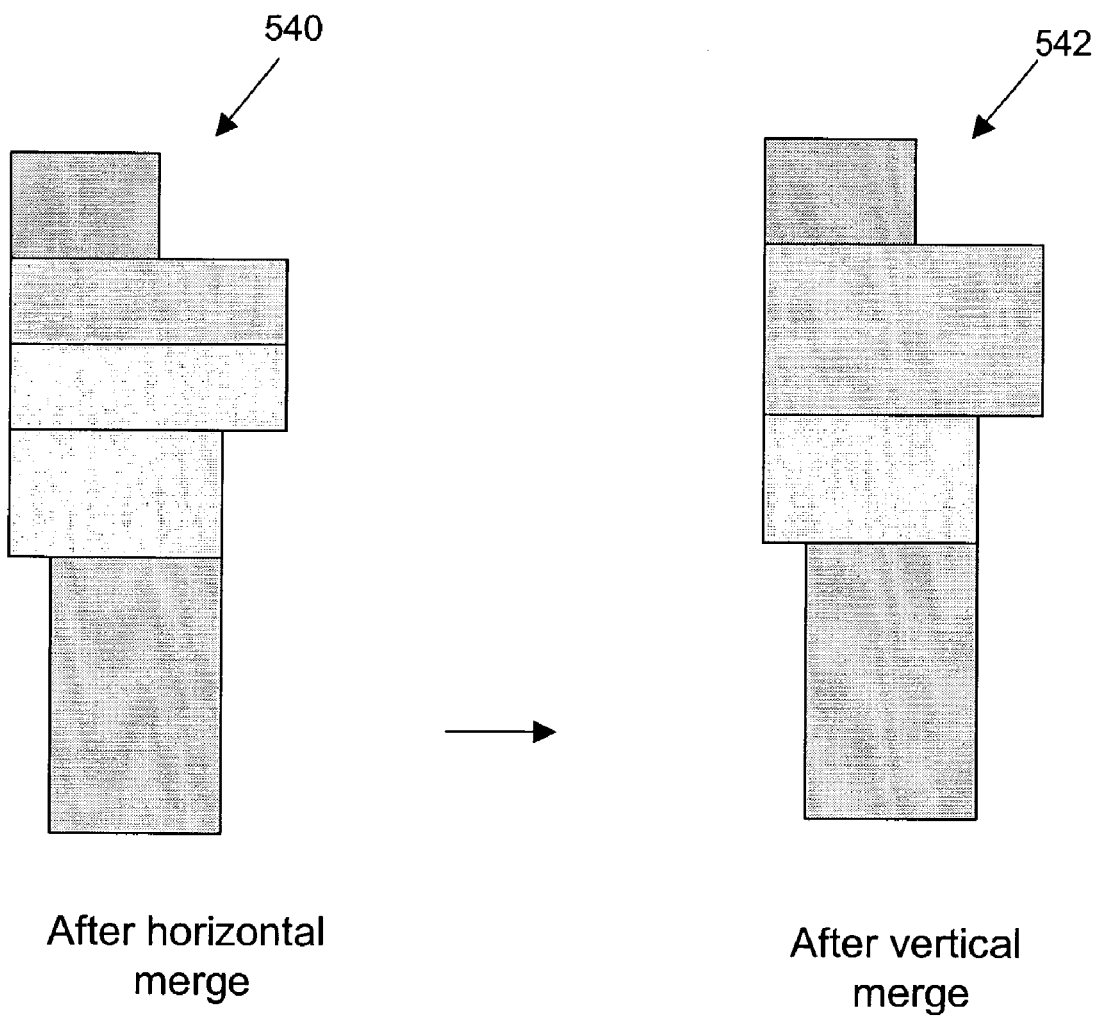

Horizontal and/or vertical merging are next performed (420). FIG. 5*b* illustratively shows the found rectangles first undergoing vertical merge (530) and then horizontal merge (532). Based on the preferred routing layer, one can perform the merging and extracting on reversed direction. For example, FIG. 5*c* illustratively shows the found rectangle first undergoing horizontal merge (540) and then vertical merge (542).

Referring back to FIG. 2, for each layer, the process performs the actions shown in box 214. At 216, a fence is formed around each identified blockage. The correct design rule spacing for the fence is specified, for example, by the designer or manufacturer to avoid detrimentally impacting the functionality of the blockage structure.

"Whitespaces" are located and identified around the fenced blockages. Whitespaces are open areas where metal-fills can be inserted without causing DRC (design rule checking) violations. Each whitespace is bordered by the edges of fenced blockages and region boundary. The procedure to find whitespaces is similar to the merge/extract procedure explained with reference to FIG. 4, but the rectangle extraction is reversed.

Figure 6:
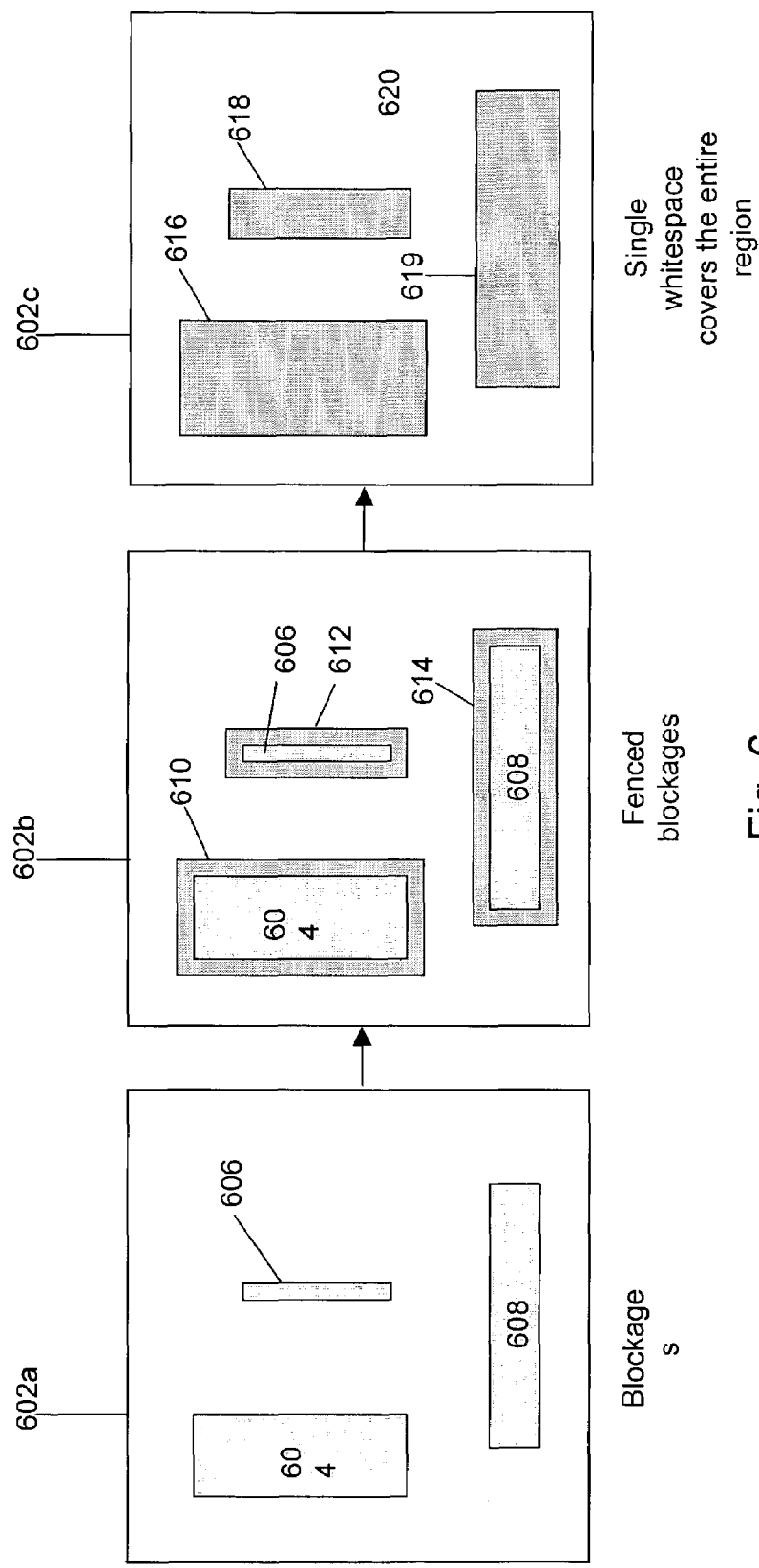
FIG. 6 illustrates a process for identifying whitespace according to an embodiment of the invention.

FIG. 6 illustrates this process of identifying whitespaces. Window 602*a* shows blockages 604, 606, and 608. Window 602*b* shows a fence formed around each blockage. Thus, fence 610 is formed around blockage 604, fence 612 around blockage 606, and fence 614 around blockage 608. The combined geometric dimensions of each blockage plus it associated fence is shown in window 602*c*. In particular, fenced blockage structures 616, 618, and 619 are shown. The whitespace 620 comprises the open area within window 602*c* that is not inhabited by fenced blockage structures 616, 618, and 619.

After whitespaces are formed, a whitespace is likely bordered by other whitespaces. If this occurs, the boundary of the whitespace is shrunk by the required spacing. Therefore, the joint whitespaces are separated at step 220. The procedure to check if a whitespace touches other whitespaces is described below:

```
Sort whitespaces from largest to smallest.
Build kd-tree with one single largest whitespace.
For each current remaining whitespace do
    Find whitespaces in kd-tree.
    If found whitespaces
        Adjust current whitespace boundary.
    End If
    Insert current whitespace in kd-tree
End For
```

Figure 7:
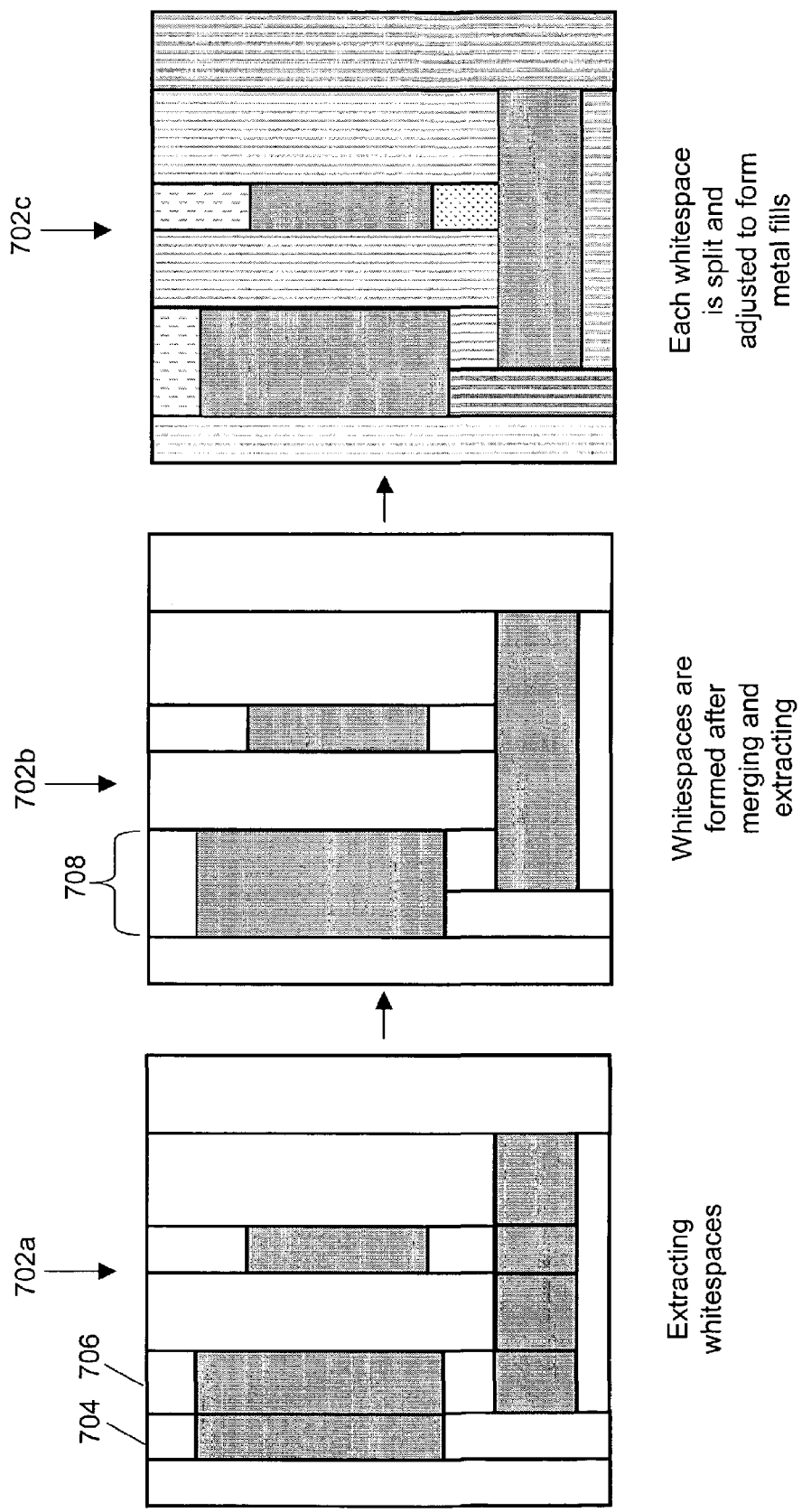
FIG. 7 illustrates a process for converting whitespace into metal-fill according to an embodiment of the invention.

Windows 702*a* and 702*b* in FIG. 7 illustrate this process of separating and forming whitespaces. As shown in window 702*a*, the edge of each fenced blockage is used to define the boundary of a potential whitespace portions for the joint whitespaces. In some cases, multiple whitespace portions can be combined together to form a larger, rectangular whitespace portion. For example, whitespace portions 704 and 706 in window 702*a* are combined together to form the combined whitespace portion 708 in window 702*b*.

Once the whitespaces have been defined, each whitespace is split into smaller metal-fills at step 222 to form a metal-fill pattern in the whitespaces (window 702*c* of FIG. 7). In one approach, each whitespace is split first in the direction of the preferred routing layer, then in another direction (e.g., a perpendicular direction) if no tie-off net is selected or if the metal length is longer than the maximum length specified. This process creates the initial metal-fill shapes for the whitespace.

Figure 1:
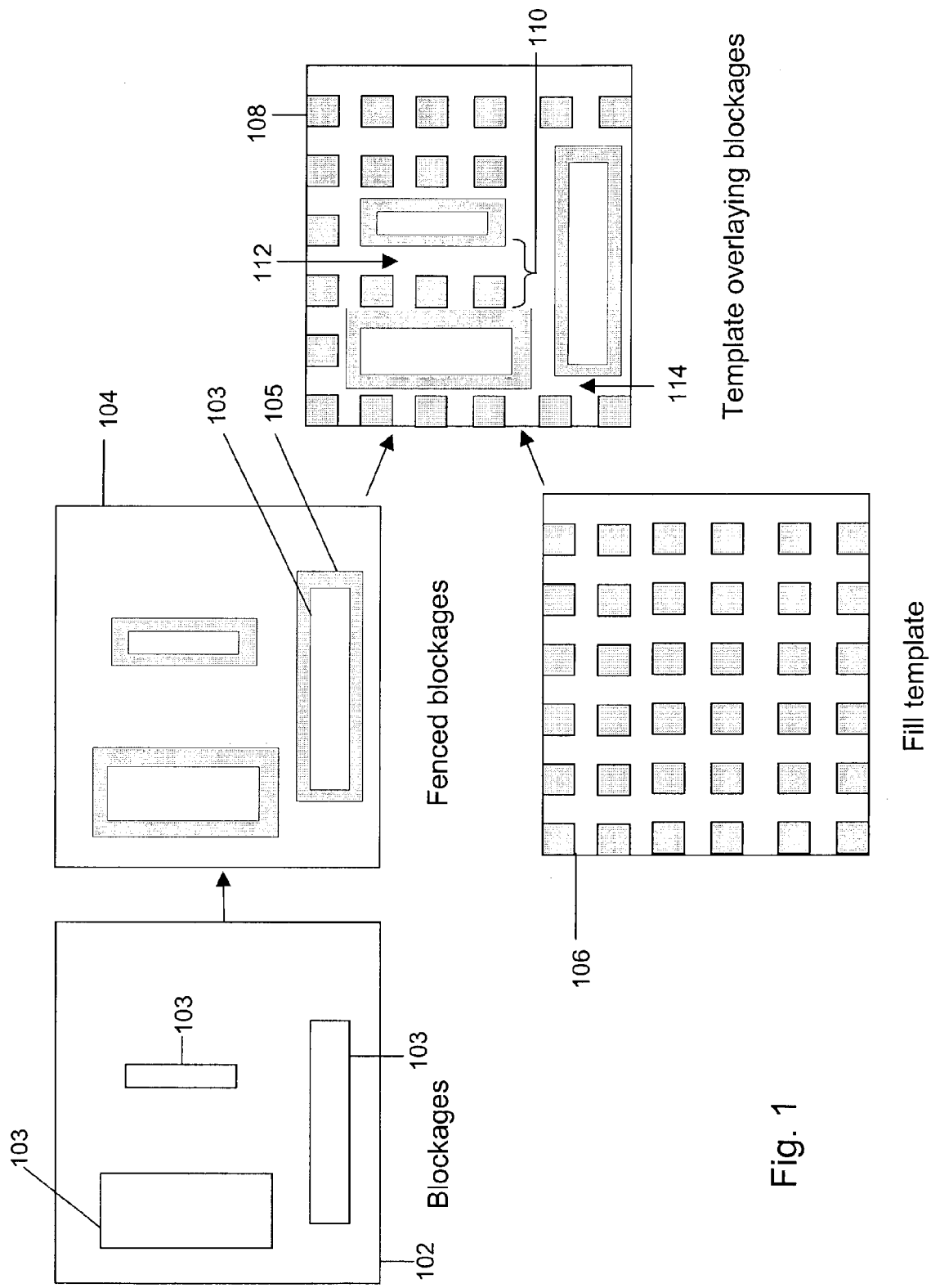
FIG. 1 shows a fixed template approach for implementing metal-fill.
Figure 8:
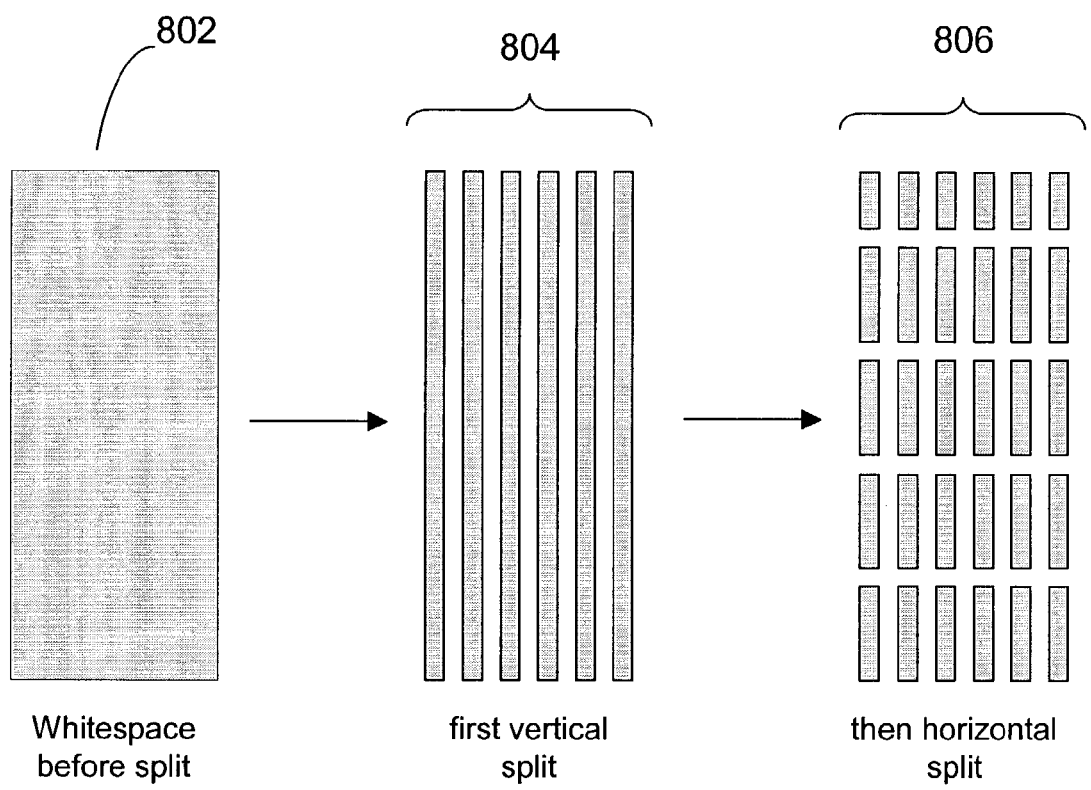
FIG. 8 illustrates a process for splitting whitespace into metal-fill according to an embodiment of the invention.

FIG. 8 illustrates this procedure. Shown in FIG. 8 is a whitespace portion 802. Initially, the whitespace is split in the vertical direction to form a series of long wires 804 as a vertical metal-fill pattern. The length of the fill lines correspond to the length of the whitespace. Since the whitespace is being split according to the existing dimensions of the individual whitespace, this inherently prevents the offset problem seen with the fixed template approach of FIG. 1 (e.g., as shown in the unbalanced metal-fill of portion 110 in FIG. 1). In one embodiment, the wire direction for the metal-fill matches the routing direction for the layer at interest. Thus, if the routing direction for the layer is horizontal, the initial wire-fill pattern would be a set of horizontal wires.

If desired, the long wires of the metal-fill pattern can be split again in another direction to form smaller metal-fill pattern elements, as shown by elements 806 in FIG. 8. One reason for performing this additional split is to provide a smaller granularity of metal-fill elements, which allows greater control over the exact amount and selection of metal-fill to put into (or remove) from a particular window. As described in more detail below, the metal-fill elements can be removed to configure the window to meet minimum, maximum, or even preferred density values.

Figure 9:
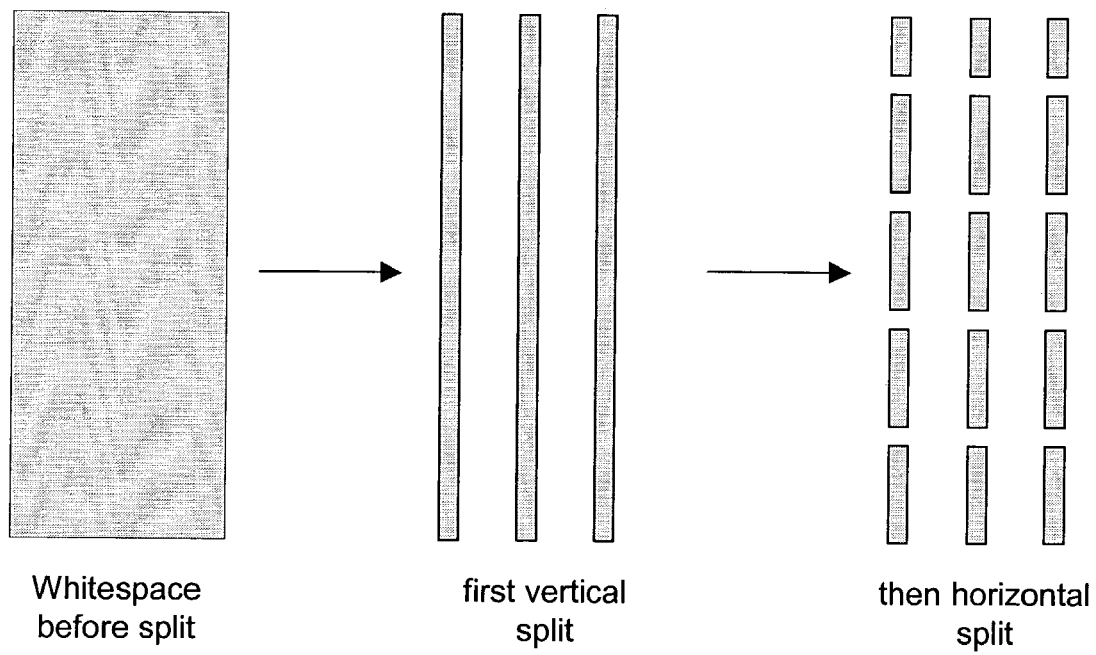
FIGS. 9 and 10 show alternate metal-fill patterns according to an embodiment of the invention.
Figure 10:
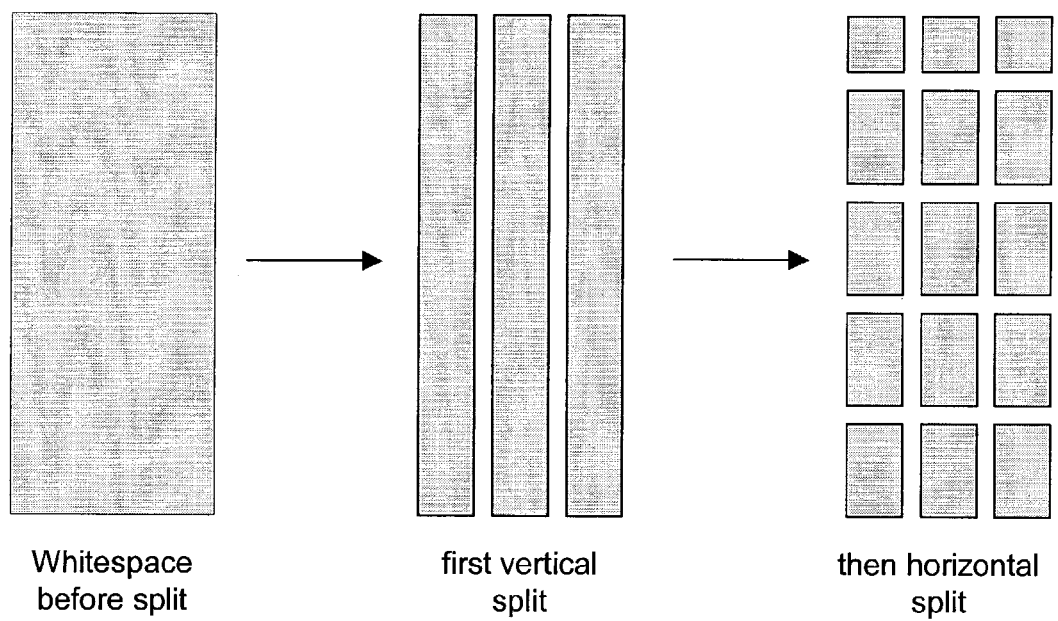

The exact metal-fill pattern used in a particular whitespace can be adjusted to change the amount of metal-fill in each whitespace or window. If a particular window has a low density value, then the metal-fill pattern can be selected to deposit a greater amount of metal. If a window already has a high density value, then the shape, spacing, or dimensions of the metal-fill pattern can be adjusted to reduce the amount of metal deposited in the whitespace for that window. For example, the spacing between the metal-fill elements can be adjusted. FIG. 9 illustrates a metal-fill pattern which has a wider spacing between metal-fill elements than the metal-fill pattern of FIG. 8. In addition, the dimensions of the metal-fill elements themselves can be adjusted. FIG. 10 illustrates a metal-fill pattern in which the wires have a greater width than the wires of the metal-fill pattern of FIG. 8. It is noted that these variations in metal-fill (e.g., shape, width, length, offset, etc.) may occur across multiple overlapping windows.

In addition to the minimum and maximum density parameters, a manufacturer often has a preferred or desired density for the metal-fill percentage of a given window. The present approach allows one to not only meet the minimum and maximum density requirements, but to tailor the exact amount of metal that is deposited to match the preferred density. To accomplish this, the post-fill density of the window is determined (224). If the metal-fill percentage of the window exceeds the preferred density, then the metal-fill pattern for that window is modified to attempt to match the preferred percentage. In one approach, this is accomplished by removing metal-fill from the window (226).

Figure 11:
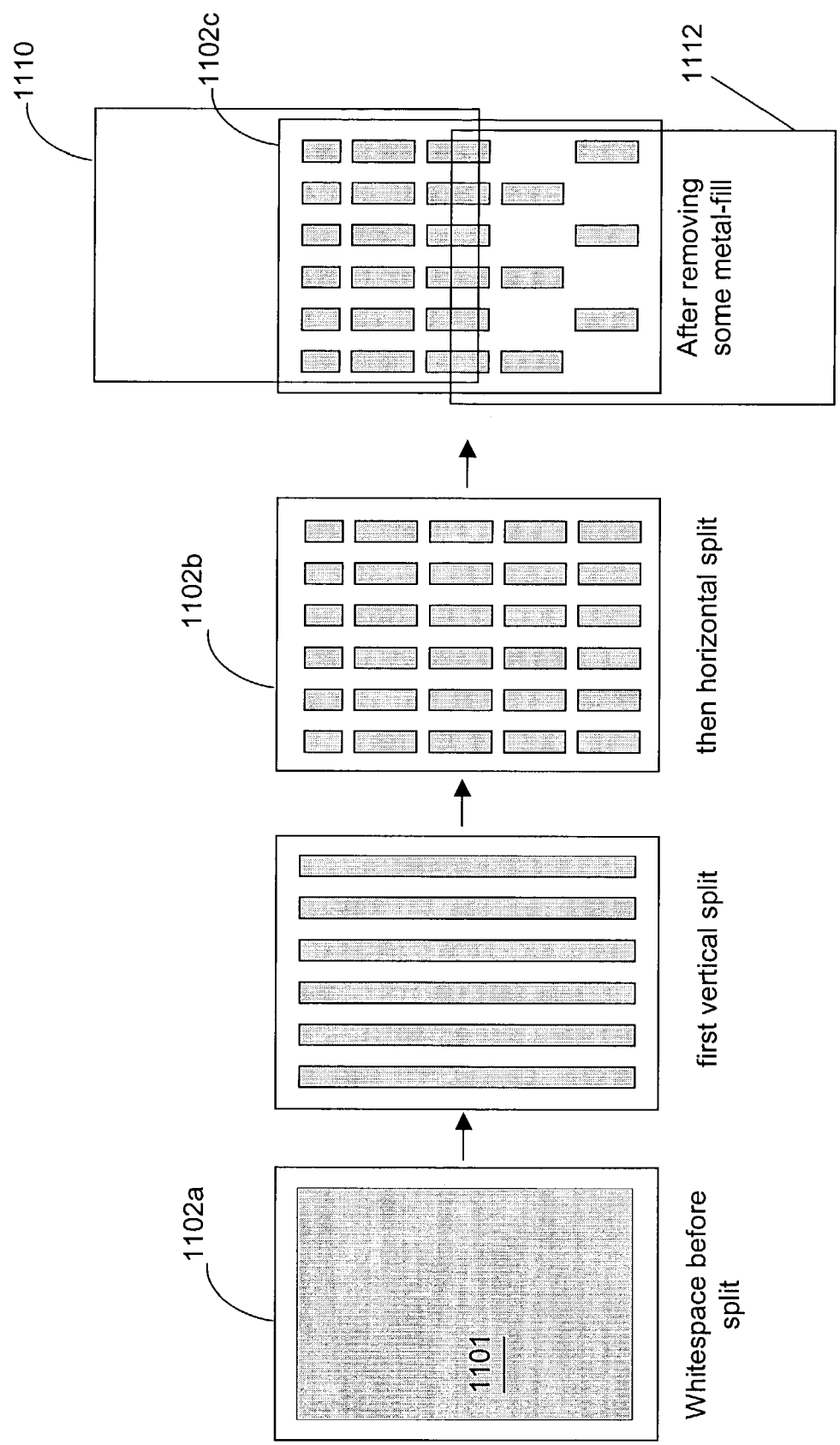
FIG. 11 illustrates a process for removing metal-fill according to an embodiment of the invention.

The density values of neighboring, overlapping windows can be considered when determining how to adjust the metal-fill in a particular window. This is illustrated by the metal-fill procedure shown in FIG. 11. In this figure, the whitespace 1101 in window 1102*a* has been split both vertically and horizontally to form a repeating pattern of whitespace elements in window 1102*b*.

After calculating the density in window 1102*b*, assume that it has been determined that some metal-fill elements should be removed to meet the preferred density value in this window 1102*c*. Here, the window 1102 overlaps with neighboring windows 1110 and 1112. In this example, further assume that window 1110 has a relatively low density value while window 1112 has a relatively higher density value. As a result, the metal-fill elements removed from the overlapping portions of window 1102*c* should be selected to ensure that it both benefits and does not harm the ability of the neighboring windows to achieve the desired density. Here, since neighboring window 1112 already has a relatively high density, excess metal-fill from window 1102*c* can be removed from the portion of this window that overlaps window 112 to help ensure that window 112 does not exceed the maximum density, and preferably meets the desired density. Since neighboring window 1110 has a relatively low density, no or little metal-fill is removed from the overlapping portion between window 1110 and window 11102*c*.

The following describes an embodiment of an approach for removing metal-fill if there are windows that exceed preferred density after computing post-filled density for all windows:

```
Build kd-tree from all metal-fills created.
Sort windows with largest density first.
For each window do
    If window density less than preferred then
        exit window loop.
    Find metal-fills in window from kd-tree.
    For each found metal-fill do
        Evaluate impact of density on neighboring windows.
        Assign a score to each metal-fill.
    End For
    Remove metal-fills with best scores. This minimizes impact on
        neighboring windows while attempting to achieve preferred
        density.
End For
```

The list of metal-fills is maintained to track the changes to the design (228).

Figure 12:
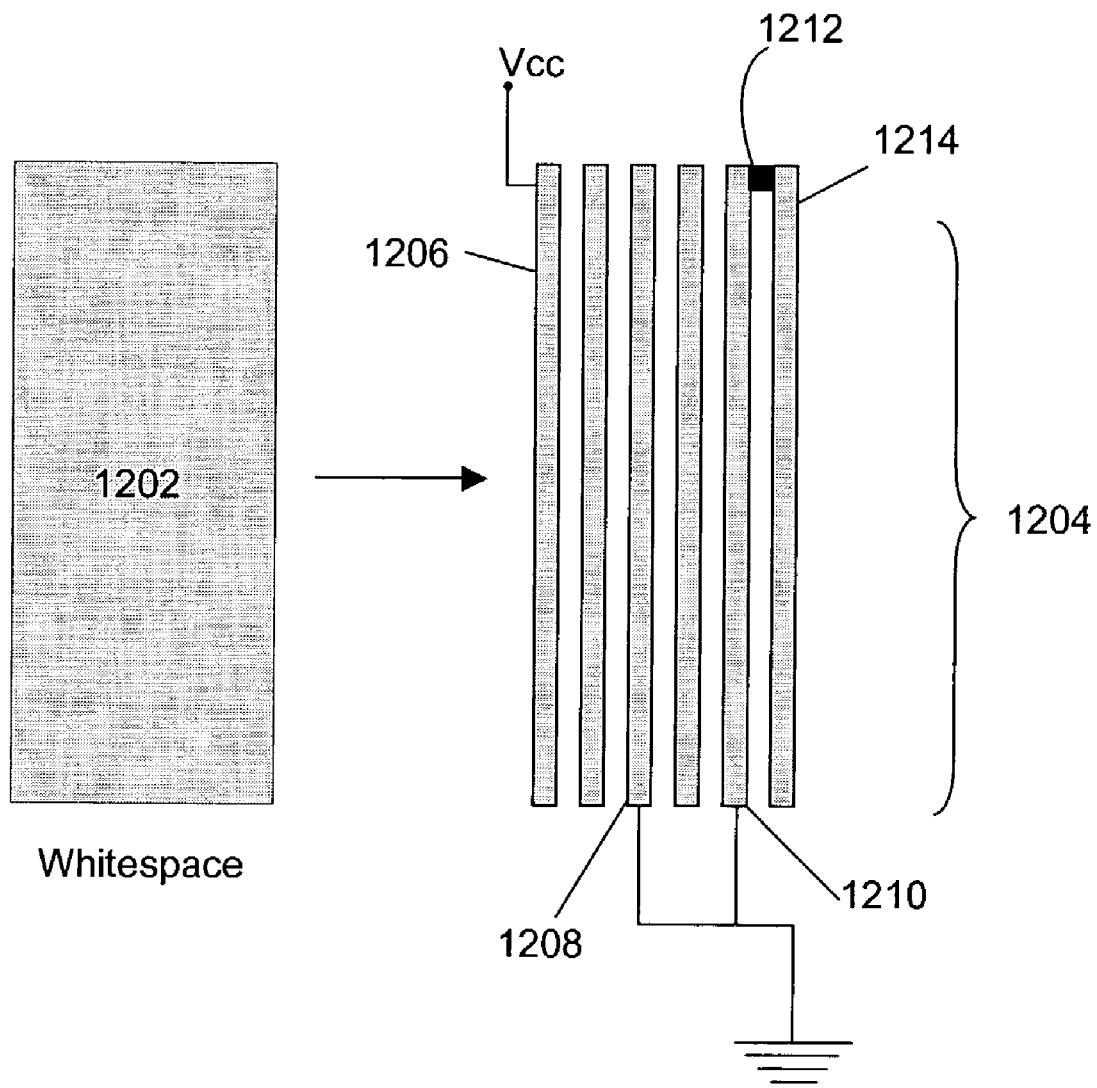
FIG. 12 illustrates connection of metal-fill to ground and power.

At 232, the metal-fill wires are processed with respect to tie-off nets (if they exist). In conventional systems, metal-fill is left floating on the chip. In the present invention, the metal-fill can be designed to tie-off at either power or ground. This aspect of the invention is illustrated in FIG. 12. Once again, the process begins with an identified whitespace 1202 that is split into a set of wires 1204 to form the metal-fill. Here, a first wire 1206 has been connected to Vcc, while wires 1208 and 1210 have been connected to ground. In one embodiment, a search can be made to determine if there are available power and/or ground connections that can be made, either on the same layer or on another layer. If the available connection is on another layer, then a via is dropped to the appropriate layer to make the connection. If the available connection is on the same layer, then the wire in the metal-fill can be routed to that connection on the same layer. In fact, one wire can be routed to another wire in the metal-fill to make the power or ground connection, as shown by route 1212 between wires 1210 and 1214 in FIG. 12.

The following describes an embodiment of a process for implementing the metal-fill wires to connect to tie-off nets:

```
If tie-off net exists
    Create ConnectTree using wires of tie-off nets
    While ConnectTree exists do
        For each floating fill in list do
            Find tie-off target in ConnectTree
            If target found
                Drop via to make connection
                Mark this fill as connected fill
            End If
        End For
        Delete ConnectTree
        Create new ConnectTree using connected fills
    End While
End If tie-off net
```

In this process, a ConnectTree refers to a tree of existing wires that connect to power and ground. Wire segments of tie-off nets are placed in tree (kd-tree) to facilitate area lookup. This tree is constantly growing, since any wire in the metal-fill that connects to power and ground provides yet another connection for power or ground that is accessible by other wires in the metal-fill. This process keeps track of these connections as a tree structure. As is evident, any later connections can be tied to any point in the tree of connections. Any wire type, shape or width can be filtered and excluded as potential target if desired.

For the act of finding a tie-off target in ConnectTree, a bounding box of each floating fill can be used to search in ConnectTree (kd-tree) for potential tie-off net targets for a connection. A potential target is then checked to ensure a via can be inserted without causing DRC violation. If stack via is not allowed, in one embodiment, a potential target must be within one layer (above or below) from the floating fill layer. The size of the via can be selected based on the via rule generation definition. The metal and cut spacing are taken into account to ensure no DRC violations occur as the via is inserted.

In the step of creating a new ConnectTree using connected fills, the old ConnectTree is no longer needed and hence can be removed. The new ConnectTree is created using only connected fills of the last pass. The loop iterates until there are no more connected fill from the last pass (i.e., ConnectTree is nil).

Figure 13:
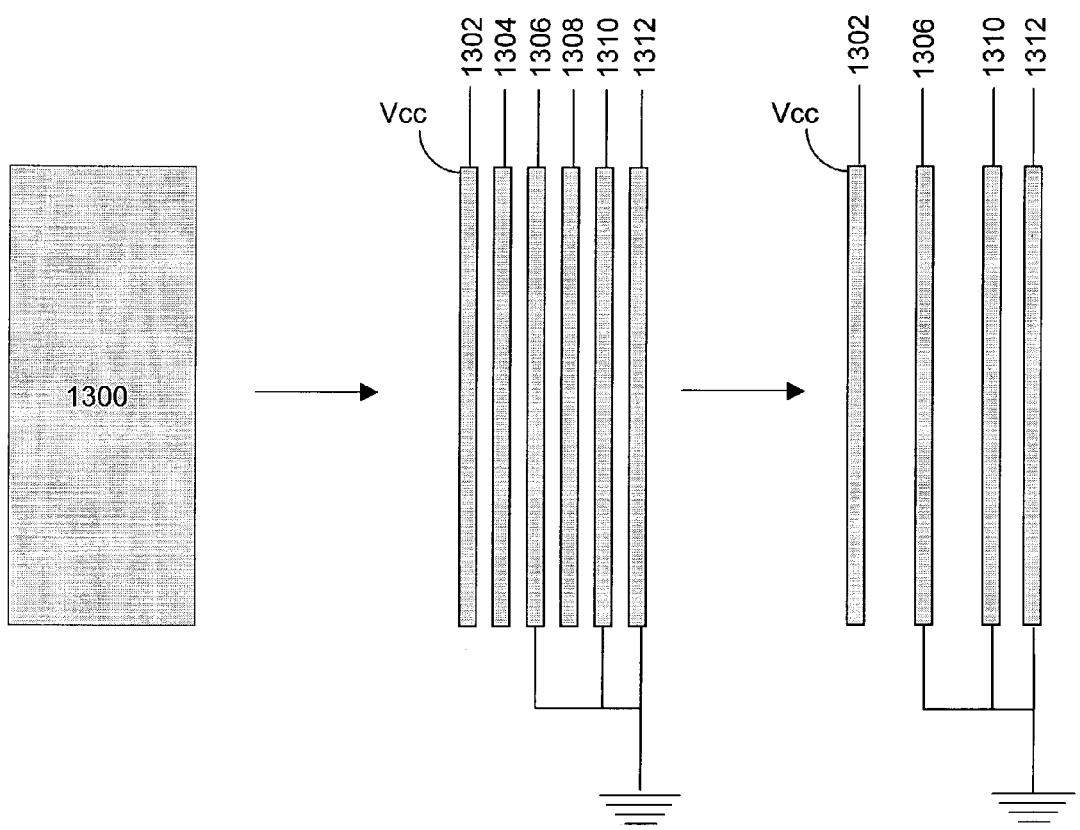
FIG. 13 illustrates a process for removing selected metal-fill elements when some elements are connected to power or ground.

When removing metal-fill to achieve a preferred density, one factor that can be taken into account is whether a particular wire-fill element is tied to power or ground. To illustrate, consider the metal-fill pattern shown in FIG. 13. Whitespace 1300 has been split to create a set of wires 1302, 1304, 1306, 1308, 1310, and 1312 in the wire-fill pattern. Wire 1302 has been connected to Vcc while wires 1306, 1310, and 1312 have been connected to ground. Assume that two wires need to be removed from the wire-fill to achieve the preferred density for the window associated with whitespace 1302. Here, since wires 1304 and 1308 are the only two wires not tied off to power or ground, all else being equal, these two wires would be selected to be removed.

Returning back to FIG. 2, at step 234, once the tie-off nets have been processed, the list of metal-fills can be written out. In one approach, metal-fills connected to tie-off net are written out in the special net section whereas floating fills are output in the fill section.

Figure 14:
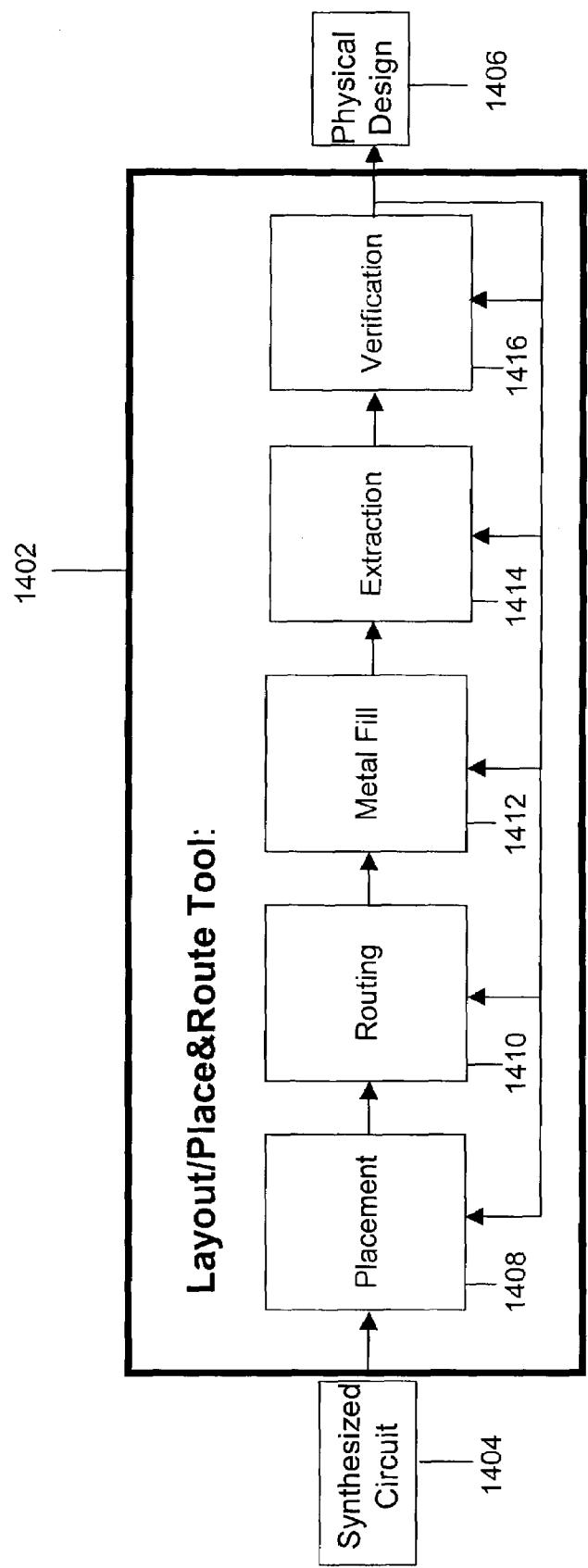
FIG. 14 shows architecture for implementing a metal-fill mechanism according to an embodiment of the invention.

FIG. 14 shows architecture for implementing the present metal-fill mechanism according to one embodiment of the invention. In this approach, the metal-fill mechanism 1412 is integrated into the layout/place&route tool 1402. In general, a layout/place & route tool takes as input a synthesized gate-level netlist 1404 of a circuit design, and this tool thereafter uses a placement portion 1408 to place the logic gates and uses a routing portion 1410 to route the tracks on a floorplan to physically implement the design 1406. An extraction tool 1414, which may be either internal or external to the place & route tool 1402, extracts the electrical characteristics associated with elements of the physical design (e.g., resistance, capacitance, and inductance). These characteristics may be used by a verification tool 1416 to verify the appropriateness of the physical design. For example, verification can be performed to identify timing or crosstalk problems caused by the layout. If these problems are found, then the placement or routing is changed to correct the problem.

By integrating the metal-fill mechanism 1412 into the layout/place&route tool 1402, this allows designers to discover and fix problems that may be caused by the metal-fill earlier in the design flow. In effect, the metal-fill becomes just another set of features of the physical design that is verified during the ordinary course of performing extraction and verification upon the layout. Moreover, integrating the metal-fill mechanism into the layout/place&route tool allow the tool to ensure that sufficient information is available to adequately perform verification. If the metal-fill process is performed later in the design flow, then it is possible that some necessary item of information about either the metal-fill or other features in the layout will not be sufficiently or readily available to adequately perform verification.

In this way, it can be seen that a single-pass approach has been described for implementing metal-fill for an integrated circuit design. Rather than having to iterate multiple times over the same design with multiple fixed fill patterns and/or offsets to satisfy density requirements (as required with the fixed template approach), the present approach allows a single pass through the embodied procedure to configure the metal-fill to meet the density requirements. Moreover, the present approach allows one to fine-tune the metal-fill, during that single pass, to address preferred density values, and not just the minimum and maximum density requirements.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the exact ordering and/or content of the described process actions may be changed without affecting the scope or operation of the invention. The specification and drawings are, accordingly, to be regarded in an illustrative rather than restrictive sense.

What is claimed is:

1. A system for implementing metal-fill, comprising:
   (a) means for partitioning a circuit design into a plurality of windows;
   (b) means for identifying a blockage;
   (c) means for building a fenced blockage;
   (d) means for identifying whitespace relating to the fenced blockage;
   (e) means for configuring the whitespace with metal-fill;
   (f) means for removing excess metal-fill from the whitespace,
      wherein (a)-(f) are performed without requiring manual iterations of offsetting or different metal-fill templates; and
   (g) a place and route tool having a placement portion, wherein the place and route tool has a mechanism for implementing metal-fill, in which the metal fill is implemented by identifying a whitespace in which the metal fill is desired and splitting the whitespace in at least two directions to form a repeating pattern for implementing the metal fill and removing metal-fill from the whitespace if a density value for the metal fill is determined to exceed a desired density value.

2. The system of claim 1 in which a verification mechanism operates upon the output of the mechanism for implementing metal-fill.

3. The system of claim 2 in which the verification mechanism performs timing verification.

4. The system of claim 2 in which the verification mechanism performs crosstalk analysis.

5. The system of claim 2 in which the verification mechanism checks compliance of the metal-fill with design rules.

6. The system of claim 1 in which the mechanism for implementing metal-fill performs process actions as follows:
   configuring metal-fill for an integrated circuit design; and
      connecting at least one element of the metal-fill to a tie-off connection.

7. The system of claim 1, wherein the place and route tool further comprises a routing portion, and the mechanism is coupled to one or both of the placement portion and the routing portion.

8. The system of claim 1, wherein the placement portion is also configured for placing metal-fill.

9. The system of claim 1 for implementing metal-fill, in which the mechanism in one pass implements a density value for a portion of an integrated circuit within a specified threshold range.

10. The system of claim 9, in which a verification mechanism operates upon the output of the mechanism for implementing metal-fill.

11. The system of claim 1 for implementing metal-fill, in which splitting the whitespace in at least two directions comprises splitting the whitespace in a first direction to form a series of long rectangular elements and in a second direction that is perpendicular to the first direction to form a repeating pattern of smaller rectangular elements for implementing the metal fill.

12. The system of claim 11, in which a verification mechanism operates upon the output of the mechanism for implementing metal-fill.

13. A method for implementing metal-fill in an electronic circuit or an electronic circuit design, comprising:
   implementing metal-fill by a process comprising:
      (a) partitioning a circuit design into a plurality of windows;
      (b) identifying a blockage;
      (c) building a fenced blockage;
      (d) identifying a whitespace relating to the fenced blockage in which the metal fill is desired;
      (e) configuring the whitespace with metal fill by splitting the whitespace in at least two directions to form a repeating pattern; and
      (f) removing metal-fill from the whitespace if a density value for the metal fill is determined to exceed a desired density value,
         wherein (a)-(f) are performed without requiring manual iterations of offsetting or different metal-fill template; and
   storing a result of the implementing metal-fill on a tangible computer readable medium.

14. The method of claim 13 further comprises:
performing verification of the electronic circuit or an electronic circuit design.

15. The method of claim 13 further comprises:
configuring metal-fill for an integrated circuit design; and
connecting at least one element of the metal-fill to a tie-off connection.

16. The method of claim 13, in which splitting the whitespace in at least two directions comprises splitting the whitespace in a first direction to form a series of long rectangular elements and in a second direction that is perpendicular to the first direction to form a repeating pattern of smaller rectangular elements for implementing the metal fill.

17. The method of claim 13, in which the at least two directions comprise a routing direction of a layer.

18. The method of claim 17, in which the at the at least two directions comprise a direction not parallel to the routing direction.

19. The method of claim 17, in which the layer constitutes a preferred routing layer.

20. A computer program product storing a computer program of instructions which, when executed by a processing system, cause the processing system to perform a method for implementing metal-fill in an electronic circuit or an electronic circuit design, the method comprising:
implementing metal-fill by a process comprising:
(a) partitioning a circuit design into a plurality of windows;
(b) identifying a blockage;
(c) building a fenced blockage;
(d) identifying a whitespace relating to the fenced blockage in which the metal fill is desired;
(e) configuring the whitespace with metal fill by splitting the whitespace in at least two directions to form a repeating pattern; and
(f) removing metal-fill from the whitespace if a density value for the metal fill is determined to exceed a desired density value,
wherein (a)-(f) are performed without requiring manual iterations of offsetting or different metal-fill template; and
storing a result of the implementing metal-fill on a tangible computer readable medium.

21. The computer program product of claim 20, in which the process further comprises:
performing verification of the electronic circuit or an electronic circuit design.

22. The computer program product of claim 20, in which the process further comprises:
configuring metal-fill for an integrated circuit design; and
connecting at least one element of the metal-fill to a tie-off connection.

23. The computer program product of claim 20, in which splitting the whitespace in at least two directions comprises splitting the whitespace in a first direction to form a series of long rectangular elements and in a second direction that is perpendicular to the first direction to form a repeating pattern of smaller rectangular elements for implementing the metal fill.

24. The computer program product of claim 20, in which the at least two directions comprise a routing direction of a layer.

25. The computer program product of claim 24, in which the at the at least two directions comprise a direction not parallel to the routing direction.

26. The computer program product of claim 24, in which the layer constitutes a preferred routing layer.

* * * * *